United States Patent
Wang et al.

(10) Patent No.: US 6,509,259 B1
(45) Date of Patent: Jan. 21, 2003

(54) PROCESS OF USING SILOXANE DIELECTRIC FILMS IN THE INTEGRATION OF ORGANIC DIELECTRIC FILMS IN ELECTRONIC DEVICES

(75) Inventors: Shi-Qing Wang, Campbell, CA (US); Jude Dunne, Menlo Park, CA (US); Lisa Figge, Menlo Park, CA (US)

(73) Assignee: AlliedSignal Inc., Morristown, NJ (US)

( * ) Notice: Subject to any disclaimer, the term of this patent is extended or adjusted under 35 U.S.C. 154(b) by 0 days.

(21) Appl. No.: 09/328,648

(22) Filed: Jun. 9, 1999

(51) Int. Cl.[7] .................. H01L 21/4763; H01L 21/302; H01L 21/461
(52) U.S. Cl. ................ 438/623; 438/624; 438/634; 438/640; 438/740
(58) Field of Search ................ 438/623, 624, 438/634, 640, 492, 740; 428/195, 447

(56) References Cited

U.S. PATENT DOCUMENTS

| | | | | |
|---|---|---|---|---|
| 4,626,556 A | * | 12/1986 | Nozue et al. ............ 522/99 |
| 5,114,780 A | * | 5/1992 | Mercer et al. .......... 428/195 |
| 5,155,175 A | * | 10/1992 | Mercer et al. .......... 525/390 |
| 5,801,094 A | | 9/1998 | Yew et al. ............. 438/624 |
| 5,858,544 A | * | 1/1999 | Holl et al. ............ 428/447 |
| 5,858,877 A | * | 1/1999 | Dennison et al. ......... 438/700 |
| 5,886,410 A | * | 3/1999 | Chiang et al. .......... 257/759 |
| 5,998,522 A | | 12/1999 | Nakano et al. .......... 524/315 |
| 6,027,995 A | * | 2/2000 | Chiang et al. .......... 438/623 |
| 6,043,145 A | * | 3/2000 | Suzuki et al. .......... 438/622 |
| 6,071,809 A | * | 6/2000 | Zhao .................. 438/634 |
| 6,218,317 B1 | | 4/2001 | Allada et al. .......... 438/780 |

OTHER PUBLICATIONS

"High Stud–To–Line Contact Area in Damascene Metal Processing"; IBM Technical Disclosure Bulletin, vol. 33, No. IA, Jun. 1990.

* cited by examiner

Primary Examiner—Olik Chaudhuri
Assistant Examiner—Shrinivas H. Rao
(74) Attorney, Agent, or Firm—Roberts & Mercanti, LLP

(57) ABSTRACT

The invention relates to cured dielectric films and a process for their manufacture which are useful in the production of integrated circuits. Dual layered dielectric films are produced in which a lower layer comprises a non-silicon containing organic polymer and an upper layer comprises an organic, silicon containing polymer. Such films are useful in the manufacture of microelectronic devices such as integrated circuits (IC's). In one aspect the upper layer silicon containing polymer has less than 40 Mole percent carbon containing substituents, and in another aspect it has at least approximately 40 Mole percent carbon containing substituents.

6 Claims, No Drawings

PROCESS OF USING SILOXANE DIELECTRIC FILMS IN THE INTEGRATION OF ORGANIC DIELECTRIC FILMS IN ELECTRONIC DEVICES

BACKGROUND OF THE INVENTION

1. Field of the Invention

The present invention relates to cured, dual layered dielectric films and to a process for their production. More particularly, the invention pertains to dual layered dielectric films in which a lower layer comprises a non-silicon containing organic polymer-and an upper layer comprises an organic, silicon containing polymer. Such films are useful in the manufacture of microelectronic devices such as integrated circuits (IC's).

2. Description of the Related Art

A continuing trend in the field of semiconductor technology is the formation of integrated circuit chips having more and faster circuits thereon. Such ultralarge scale integration has resulted in a continued shrinkage of feature sizes with the result that a large number of devices are available on a single chip. With a limited chip surface area, the interconnect density typically expands above the chip substrate in a multi-level arrangement and so the devices have to be interconnected across these multiple levels.

The interconnects must be electrically insulated from each other except where designed to make contact. Usually electrical insulation requires depositing dielectric films onto a surface. It is known in the art that siloxane resins are useful in the electronic and semiconductor fields to provide a dielectric coating to silicon wafers and other components. Such coatings protect the surface of substrates and form dielectric layers between electric conductors on IC's. Such coatings can be used as protective layers, interlevel dielectric layers, doped dielectric layers to produce transistor like devices, capacitor and capacitor like devices, multilayer devices, 3-D devices, silicon on insulator devices, coatings for superconductors, and the like.

As mentioned above, semiconductor devices often have multiple arrays of patterned interconnect levels that serve to electrically couple individual circuit elements thus forming an integrated circuit. In the past, these interconnect levels have been separated by such insulating dielectric films as a silicon oxide film formed using chemical vapor deposition or plasma enhanced techniques. However, as the size of circuit elements and the spaces between such elements decreases, the relatively high dielectric constant of such silicon oxide films has become a problem.

In order to provide a lower dielectric constant than that of silicon oxide, dielectric films formed from siloxane based resins are becoming widely used. However, while such siloxane films do provide lower dielectric constants than silicon oxide films it has been found that typically the dielectric constants of such films are limited to those of approximately 3.0 or greater. The dielectric constant of such insulating films is an important factor where IC's with low power consumption, crosstalk, and signal delay are required. As IC dimensions continue to shrink, this factor increases in importance. As a result, siloxane based resin materials that can provide insulating films with dielectric constants below 3.0 are very desirable. Furthermore, it would be desirable to have a siloxane based resin which have a high resistance to cracking and low stress when formed in thicknesses of approximately 0.1 $\mu$m to about 1.0 $\mu$m or greater.

In addition, in the production of microelectronic devices, $SiO_2$, SiN or SiON are conventionally used as hardmasks or etch stops for the integration of low k organic films. The problem with using these films is that they have relatively high k values ($\geq 4.0$) compared with the organic films ($<3.0$). This invention describes the use of low k, siloxane based polymer films in the integration of low k organic films. This allows the effective dielectric constant to be lower than if conventional films are used.

The different chemical structure of siloxane based polymers compared to non-silicon containing organic polymers require different etch chemistries. Etch chemistries used for low k non-silicon containing organic polymer films typically do not etch siloxane based polymers, $SiO_2$, or SiN dielectrics. Integration of organic polymers into subtractive aluminum, damascene or dual damascene schemes typically requires that a $SiO_2$, SiN or SiON layer be placed on the organic polymer to act as an etch stop or hardmask to pattern vies and trenches. These layers have high k values ($\geq 4.0$) and reduce the effectiveness of using low k organic polymers between metal lines. Using a low k siloxane based organic polymer in a manner similar to conventional $SiO_2$, SiON or SiN films as a hardmask or etchstop will reduce effective interline capacitances.

According to the invention, a high or low organic content siloxane film is spun onto either baked or cured films of a non-silicon containing low k dielectric film. The high or low organic content siloxane film is used as an etch-stop or a hardmask, similar to standard $SiO_2$, SiON or SiN in a variety of integration techniques including subtractive aluminum, and damascene and dual damascene processes.

SUMMARY OF THE INVENTION

The invention provides a dielectric coated substrate such as a microelectronic device which comprises:

(a) a first dielectric composition film on a substrate which comprises a non-silicon containing or substantially non-silicon containing organic polymer; and (b) a second dielectric composition film on the first dielectric film, which second dielectric composition comprises a polymer having a structure selected from the group consisting of I and II:

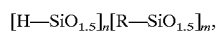

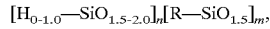

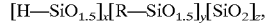    I.

wherein the sum of n and m, or the sum or x, y and z is from about 8 to about 5000, and m and y are selected such that carbon containing substituents are present in an amount of less than about 40 Mole percent; and wherein R, is selected from substituted and unsubstituted straight chain and branched alkyl groups, cycloalkyl groups, substituted and unsubstituted aryl groups, and mixtures thereof;

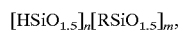

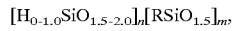    II.

wherein the sum of n and m is from about 8 to about 5000 and m is selected such that the carbon containing substituent is present in an amount of from about 40 Mole percent or greater; and $[HSiO_{1.5}]_x[RSiO_{1.5}]_y[SiO_2]_z;$ wherein the sum of x, y and z is from about 8 to about 5000 and y is selected such that the carbon containing substituent is present in an amount of about 40 Mole % or greater; and wherein R, is selected from substituted and unsubstituted straight chain and branched alkyl groups, cycloalkyl groups, substituted and unsubstituted aryl groups, and mixtures thereof.

The invention also provides a process for forming a dielectric coating on a substrate, such as a microelectronic device, which comprises (a) forming a first dielectric composition film on a substrate which comprises a non-silicon containing or substantially non-silicon containing organic polymer; and (b) forming a second dielectric composition film on the first dielectric film, which second dielectric composition comprises a polymer having a structure selected from the group consisting of I and II:

$[H\!-\!SiO_{1.5}]_n[R\!-\!SiO_{1.5}]_m,$ $[H_{0.4-1.0}SiO_{1.5-1.8}]_n[R_{0.4-1.0}\!-\!SiO_{1.5-1.8}]_m,$ $[H_{0-1.0}\!-\!SiO_{1.5-2.0}]_n[R\!-\!SiO_{1.5}]_m,$ $[H\!-\!SiO_{1.5}]_x[R\!-\!SiO_{1.5}]_y[SiO_2]_z,$  I.

wherein the sum of n and m, or the sum or x, y and z is from about 8 to about 5000, and m and y are selected such that carbon containing substituents are present in an amount of less than about 40 Mole percent; and wherein R, is selected from substituted and unsubstituted straight chain and branched alkyl groups, cycloalkyl groups, substituted and unsubstituted aryl groups, and mixtures thereof;

$[HSiO_{1.5}]_n[RSiO_{1.5}]_m,$ $[H_{0.4-1.0}SiO_{1.5-1.8}]_n[R_{0.4-1.0}SiO_{1.5-1.8}]_m,$ $[H_{0-1.0}SiO_{1.5-2.0}]_n[RSiO_{1.5}]_m,$  II.

wherein the sum of n and m is from about 8 to about 5000 and m is selected such that the carbon containing substituent is present in an amount of from about 40 Mole percent or greater; and $[HSiO_{1.5}]_x[RSiO_{1.5}]_y[SiO_2]_z;$ wherein the sum of x, y and z is from about 8 to about 5000 and y is selected such that the carbon containing substituent is present in an amount of about 40 Mole % or greater; and wherein R, is selected from substituted and unsubstituted straight chain and branched alkyl groups, cycloalkyl groups, substituted and unsubstituted aryl groups, and mixtures thereof The invention further provides a process for producing a microelectronic device which comprises:

(a) forming a first dielectric layer on a substrate which comprises a non-silicon containing or substantially non-silicon containing organic polymer;

(b) forming a second dielectric layer on the first dielectric layer, which second dielectric composition comprises a polymer having a structure selected from the group consisting of I and II:

$[H\!-\!SiO_{1.5}]_n[R\!-\!SiO_{1.5}]_m,$ $[H_{0.4-1.0}SiO_{1.5-1.8}]_n[R_{0.4-1.0}\!-\!SiO_{1.5-1.8}]_m,$ $[H_{0-1.0}\!-\!SiO_{1.5-2.0}]_n[R\!-\!SiO_{1.5}]_m,$ $[H\!-\!SiO_{1.5}]_x[R\!-\!SiO_{1.5}]_y[SiO_2]_z,$  I.

wherein the sum of n and m, or the sum or x, y and z is from about 8 to about 5000, and m and y are selected such that carbon containing substituents are present in an amount of less than about 40 Mole percent; and wherein R, is selected from substituted and unsubstituted straight chain and branched alkyl groups, cycloalkyl groups, substituted and unsubstituted aryl groups, and mixtures thereof;

$[HSiO_{1.5}]_n[RSiO_{1.5}]_m,$ $[H_{0.4-1.0}SiO_{1.5-1.8}]_n[R_{0.4-1.0}SiO_{1.5-1.8}]_m,$ $[H_{0-1.0}SiO_{1.5-2.0}]_n[RSiO_{1.5}]_m,$  II.

wherein the sum of n and m is from about 8 to about 5000 and m is selected such that the carbon containing substituent is present in an amount of from about 40 Mole percent or greater; and $[HSiO_{1.5}]_x[RSiO_{1.5}]_y[SiO_2]_z;$ wherein the sum of x, y and z is from about 8 to about 5000 and y is selected such that the carbon containing substituent is present in an amount of about 40 Mole % or greater; and wherein R, is selected from substituted and unsubstituted straight chain and branched alkyl groups, cycloalkyl groups, substituted and unsubstituted aryl groups, and mixtures thereof;

(c) imagewise patterning the dielectric layers to form vias in the dielectric layers extending to the substrate;

(d) depositing a metal into the vias and onto a top surface of the second cured dielectric layer;

(e) removing the metal from the top surface of the second cured dielectric layer.

The invention still further provides a process for producing a microelectronic device which comprises:

(a) applying a first dielectric layer onto a substrate which comprises a non-silicon containing or substantially non-silicon containing organic polymer;

(b) applying a second dielectric layer onto the first dielectric layer, which second dielectric composition comprises a polymer having a structure selected from the group consisting of I and II:

$[H\!-\!SiO_{1.5}]_n[R\!-\!SiO_{1.5}]_m,$ $[H_{0.4-1.0}SiO_{1.5-1.8}]_n[R_{0.4-1.0}\!-\!SiO_{1.5-1.8}]_m,$ $[H_{0-1.0}\!-\!SiO_{1.5-2.0}]_n[R\!-\!SiO_{1.5}]_m,$ $[H\!-\!SiO_{1.5}]_x[R\!-\!SiO_{1.5}]_y[SiO_2]_z,$  I.

wherein the sum of n and m, or the sum or x, y and z is from about 8 to about 5000, and m and y are selected such that carbon containing substituents are present in an amount of less than about 40 Mole percent; and wherein R, is selected from substituted and unsubstituted straight chain and branched alkyl groups, cycloalkyl groups, substituted and unsubstituted aryl groups, and mixtures thereof;

$[HSiO_{1.5}]_n[RSiO_{1.5}]_m,$ $[H_{0.4-1.0}SiO_{1.5-1.8}]_n[R_{0.4-1.0}SiO_{1.5-1.8}]_m,$ $[H_{0-1.0}SiO_{1.5-2.0}]_n[RSiO_{1.5}]_m,$  II.

wherein the sum of n and m is from about 8 to about 5000 and m is selected such that the carbon containing substituent is present in an amount of from about 40 Mole percent or greater; and $[HSiO_{1.5}]_x[RSiO_{1.5}]_y[SiO_2]_z;$ wherein the sum of x, y and z is from about 8 to about 5000 and y is selected such that the carbon containing substituent is present in an amount of about 40 Mole % or greater; and wherein R, is selected from substituted and unsubstituted straight chain and branched alkyl groups, cycloalkyl groups, substituted and unsubstituted aryl groups, and mixtures thereof;

(c) imagewise patterning the second dielectric layer to form trenches in the dielectric layers extending to the first dielectric layer;

(d) imagewise patterning the first dielectric layer to form vias in the first dielectric layer extending to the substrate;

(e) depositing a metal into the vias, trenches and onto a top surface of the second dielectric layer;

(f) removing the metal from the top surface of the second dielectric layer.

DETAILED DESCRIPTION OF THE INVENTION

The first step in conducting the process of the present invention is to form a dielectric composition on a substrate which comprises one or more polymers selected from the group consisting of poly(arylene ether), a fluorinated poly(arylene ether), fluorocarbons, benzocyclobutene, polyimides and fluorinated polyimides.

The substrate may comprise semiconductor materials such as gallium arsenide, germanium, lithium niobate, silicon and compositions containing silicon such as silicon germanium, crystalline silicon, polysilicon, amorphous silicon, epitaxial silicon, and silicon dioxide, doped silicon dioxide, silicon nitride, and polysilicon, metals such as aluminum, tantalum, copper, and aluminum/copper mixtures, ceramics, polymeric resins, Group III/V compounds and combinations thereof.

Lines may optionally be on the substrate surface. The lines, when present, are typically formed by well known lithographic techniques and may be composed of a metal, an oxide, a nitride or an oxynitride. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances preferably of from about 20 micrometers or less, more preferably from about 1 micrometer or less, and most preferably of from about 0.05 to about 1 micrometer.

The dielectric composition may comprise any of a wide variety of non-silicon containing dielectric forming materials which are well known in the art for use in the formation of microelectronic devices. The dielectric layer may nonexclusively include poly(arylene ether), a fluorinated poly(arylene ether), fluorocarbons, benzocyclobutene, polyimides and fluorinated polyimides. Fluorinated and nonfluorinated poly(arylethers) available under the tradename FLARE™ from Allied Signal Inc., and copolymer mixtures thereof The dielectric composition may comprise a preformed poly(arylene ether) or fluorinated poly(arylene ether) polymer or pre-polymers in a monomeric state or oligomeric state may be formed on the substrate with subsequent polymerization. Suitable poly(arylene ethers) or fluorinated poly(arylene ethers) are known in the art from U.S. Pat. Nos. 5,155,175; 5,114,780 and 5,115,082. Preferred poly(arylene ethers) and fluorinated poly(arylene ethers) are disclosed in U.S. patent application Ser. No. 08/990,157 filed Dec. 12, 1997 which is incorporated herein by reference. Polyimides and fluorinated polyimides are commercially available from DuPont. Fluorocarbons are commercially available from DuPont under the tradename Teflon or from Asahi Chemicals under the tradename Cytop. Benzocyclobutene is commercially available form Dow Chemicals under the tradename BCB. Other useful polymers include parylene which is commercially available from Novellus under the tradename Alpha. The polymer may be present in the dielectric composition in a pure or neat state (not mixed with any solvents) or it may be present in a solution where it is mixed with solvents. When solvents are present, the polymer is preferably present in an amount of from about 1% to about 50% by weight of the polymer, more preferably from about 3% to about 20%. The solvent component is preferably present in an amount of from about 50% to about 99% by weight of the dielectric composition, more preferably from about 80% to about 97%. Suitable solvents nonexclusively include aprotic solvents such as cyclic ketones including cyclopentanone, cyclohexanone, cyclohexanone and cyclooctanone; cyclic amides such as N-allylpyrrolidinone wherein the alkyl group has from 1 to about 4 carbon atoms, and N-cyclohexyl-pyrrolidinone, and mixtures thereof. Once formed, the dielectric composition is deposited onto a suitable substrate to thereby form a polymer layer on the substrate. Deposition may be conducted via conventional spin-coating, dip coating, roller coating, spraying, chemical vapor deposition methods, or meniscus coating methods which are well-known in the art. Spin coating is most preferred. The thickness of the polymer layer on the substrate may vary depending on the deposition procedure and parameter setup, but typically the thickness may range from about 500 Å to about 50,000 Å, and preferably from about 2000 Å to about 12000 Å. The amount of dielectric composition applied to the substrate may vary from about 1 ml to about 10 ml, and preferably from about 2 ml to about 8 ml. In the preferred embodiment, the liquid dielectric composition is spun onto the upper surface the substrate according to known spin techniques. Preferably, the polymer layer is applied by centrally applying the liquid dielectric composition to the substrate and then spinning the substrate on a rotating wheel at speeds ranging from about 500 to about 6000 rpm, preferably from about 1500 to about 4000 rpm, for about 5 to about 60 seconds, preferably from about 10 to about 30 seconds, in order to spread the solution evenly across the substrate surface. The polymer layer preferably has a density of from about 1 g/cm³ to about 3 g/cm³.

In one embodiment of the invention, the first dielectric composition film is applied to the substrate and cured, and then the second dielectric composition film is applied to the cured first dielectric composition film and then cured. In another embodiment of the invention the first dielectric composition film is applied to the substrate and then the second dielectric composition film is applied to the first dielectric composition film and then both films are cured together.

Curing may be done by any means known in the art. Typically the dielectrics are cured by heating to increase its molecular weight. The heating may be conducted by conventional means such as heating on a hot plate in air or in an inert atmosphere, or it may occur in a furnace or oven in air, or in an inert atmosphere, or it may occur in a vacuum furnace or vacuum oven by the application of heat for a sufficient time and at a sufficient temperature to cure the dielectric films. Heating is preferably conducted at a temperature of from about 200° C. to about 600° C., and more preferably from about 350° C. to about 450° C. This heating is preferably performed from about 1 minute to about 360 minutes, and more preferably from about 2 to about 60 minutes. Optionally the dielectrics may be cured by electron beam exposure or by exposure to actinic light, such as UV light, to increase its molecular weight. The amount of exposure may range from about 100 mJ/cm$^2$ to about 300 mJ/cm$^2$. The dielectric may be exposed to electron beams in any chamber having a means for providing electron beam radiation to substrates placed therein. Preferably, an electron beam chamber is used which provides an large area electron source. Suitable electron beam chambers are commercially available from Electron Vision, a unit of AlliedSignal Inc., under the trade name "ElectronCure™". The principles of operation and performance characteristics of such device are described in U.S. Pat. No. 5,003,178, the disclosure of which is expressly incorporated herein by reference. The temperature of the electron beam exposure preferably ranges from about 20° C. to about 450° C., more preferably from about 150 to about 400° C. The electron beam energy is preferably from about. 1 to about 30 KeV, and more preferably from about 3 to about 10 KeV. The dose of electrons is preferably between about 500 to about 50,000 μC/cm$^2$ and more preferably from about 3,000 to about 20,000 μC/cm$^2$ The gas ambient in the electron beam tool can be any of the following gases: nitrogen, oxygen, hydrogen, argon, or xenon or any combination of these gases. The electron beam current is preferably from about 1 to about 40 mA, and more preferably from about 5 to about 20 mA.

The second dielectric layer comprises a polymer having a structure I or II. Polymers having the structure I are of low organic content where the carbon containing substituents are present in an amount of less than about 40 mole percent. These polymers are described more fully in U.S. patent application Ser. No. 09/044,831, filed Mar. 20, 1998, which is incorporated herein by reference. In accordance with the present invention, siloxane polymers having the structure with the formulae I:

[H—SiO$_{1.5}$]$_n$[R—SiO$_{1.5}$]$_m$,

[H$_{0.4-1.0}$SiO$_{1.5-1.8}$]$_n$[R$_{0.4-1.0}$—SiO$_{1.5-1.8}$]$_m$,

[H$_{0-1.0}$—SiO$_{1.5-2.0}$]$_n$[R—SiO$_{1.5}$]$_m$,

[H—SiO$_{1.5}$]$_x$[R—SiO$_{1.5}$]$_y$[SiO$_2$]$_z$, wherein the sum of n and m, or the sum or x, y and z is from about 8 to about 5000, and m and y are selected such that carbon containing substituents are present in an amount of less than about 40 mole percent. R, is selected from substituted and unsubstituted straight chain and branched alkyl groups, cycloalkyl groups, substituted and unsubstituted aryl groups, and mixtures thereof. The specific mole percent of carbon containing substituents is a function of the ratio of the amounts of starting materials. In a preferred embodiments the mole percent of carbon containing substituents is in the range of from about 15 mole percent to about 25 mole percent.

In another embodiment of the invention, one may use polymers having the structure II which are of high organic content where the carbon containing substituents are present in an amount of about 40 mole percent or more. These polymers are described more fully in U.S. patent application Ser. No. 09/044,798, filed Mar. 20, 1998, which is incorporated herein by reference. Such have the formulae II

[HSiO$_{1.5}$]$_n$[RSiO$_{1.5}$]$_m$,

[H$_{0.4-1.0}$SiO$_{1.5-1.8}$]$_n$[R$_{0.4-1.0}$SiO$_{1.5-1.8}$]$_m$,

[H$_{0-1.0}$SiO$_{1.5-2.0}$]$_n$[RSiO$_{1.5}$]$_m$, wherein the sum of n and m is from about 8 to about 5000 and m is selected such that the carbon containing substituent is present in an amount of from about 40 Mole percent or greater; and

[HSiO$_{1.5}$]$_x$[RSiO$_{1.5}$]$_y$[SiO$_2$]$_z$;

wherein the sum of x, y and z is from about 8 to about 5000 and y is selected such that the carbon containing substituent is present in an amount of about 40 Mole % or greater; and wherein R is selected from substituted and unsubstituted straight chain and branched alkyl groups, cycloalkyl groups, substituted and unsubstituted aryl groups, and mixtures thereof. The specific mole percent of carbon containing substituents is a function of the ratio of the amounts of starting materials.

Polymers in accordance with structures I and II have a polymer backbone encompassing alternate silicon and oxygen atoms. In contrast with previously known organosiloxane resins, polymers of the present invention have essentially no hydroxyl or alkoxy groups bonded to backbone silicon atoms. Rather, each silicon atom, in addition to the aforementioned backbone oxygen atoms, is bonded only to hydrogen atoms and/or R groups as defined in the formulae. By attaching only hydrogen and/or R groups directly to backbone silicon atoms in the polymer, unwanted chain lengthening and crosslinking is avoided. Consequently, the shelf life of the organohydridosiloxane polymer solutions in accordance with the present invention is enhanced as compared to previously known organosiloxane polymers. Furthermore, since silicon-carbon bonds are less reactive than silicon hydrogen bonds, the shelf life of the organohydridosiloxane polymer solutions in accordance with the invention is enhanced as compared to previously known hydridosiloxane resins. In some embodiments, the polymer backbone conformation is a cage configuration. Accordingly, there are only very low levels of reactive terminal moieties in the polymer. This also ensures that no unwanted chain lengthening polymerization will occur in solution, resulting in an extended shelf life. Each silicon atom of the polymer is bonded to at least three oxygen atoms. Moieties bonded to the polymer backbone include hydrogen and organic moieties.

Synthesis of the organohydridosiloxane polymers of this invention may be by a dual phase solvent system using a catalyst. For example, starting materials may be trichlorosilane and an organotrichlorosilane, for either an alkyl or an aryl substituted trichlorosilane. The relative ratios of the trichlorosilane and the organotrichlorosilane determine the mole percent carbon-containing substituents in the polymer.

Polymers of the structures I and II may be prepared by mixing a solution of at least one organotrihalosilane and hydridotrihalosilane to form a mixture; combining the mixture with a dual phase solvent which includes both a non-polar solvent and a polar solvent; adding a catalyst to the dual phase solvent and trihalosilane mixture, thus providing a dual phase reaction mixture; reacting the dual phase reaction mixture to produce an organohydridosiloxane; and recovering the organohydridosiloxane from the non-polar portion of the dual phase solvent system. Additional steps may include washing the recovered organohydridosiloxane to remove any low molecular weight species, and fractionating the organohydridosiloxane product to thereby classify the product according to molecular weight. The catalyst may be a phase transfer catalyst including, but not limited to, tetrabutylammonium chloride and benzyltrimethylammonium chloride. In other embodiments the catalyst is a solid phase catalyst, such as Amberjet 4200 or Amberlite 1-6766 ion exchange resin (Rohm and Haas Company, Philadelphia, Pa.). Such dielectric films formed in accordance with the present invention advantageously provide low dielectric constants, typically less than 2.7. Additionally, dielectric films in accordance with the organohydridosiloxane compositions of this invention exhibit thermal stability permitting cure temperatures of about 425 degrees Centigrade (° C.) or greater. In the preferred embodiment, the carbon containing moiety R may be a substituted or unsubstituted straight chain and branched alkyl groups have 1 to about 20 carbons; substituted and unsubstituted cycloalkyl groups may have from about 4 to about 10 carbons and the substituted and unsubstituted aryl groups have from about 6 to about 20 carbons. For example, where R is an alkyl group, R includes but is not limited to methyl, chloromethyl and ethyl groups, straight chain and branched propyl, 2-chloropropyl, butyl, t-butyl, pentyl and hexyl groups. Where R is a cycloalkyl group, R includes but is not limited to cyclopentyl, cyclohexyl, chlorocyclohexyl and cycloheptyl groups; where R is an aryl group, R includes but is not limited to phenyl, benzyl, naphthyl, tolyl and benzyl groups. It will be understood, that the specific carbon content of any specific organohydridosiloxane resin, in accordance with this invention, is a function of the mole ratio of organotrihalosilane(s) to hydridotrihalosilane starting materials employed. Thus, for any R group selected, a resin in accordance with the present invention having a carbon containing substituent present in an amount of less than about 40 Mole % for a type I structure and at least 40 Mole % is provided for a type II structure. Advantageously, embodiments in accordance with the present invention are polymers having a caged structure with a polymer backbone encompassing alternate silicon and oxygen atoms. In particular, each backbone silicon atom is bonded to at least three backbone oxygen atoms to form the aforementioned cage structure. Essentially all additional silicon bonds are only to hydrogen and the organic substituents. Thus, polymers of the present invention have essentially no hydroxyl or alkoxy groups bonded to backbone silicon atoms and crosslinking reactions are suppressed. In preparing the polymers, a mixture of the organic and hydridosilanes (e.g. trichlorosilane and methyltrichlorosilane) is added to a mixture of catalyst, hydrocarbon solvent, alcohol and water. The mixture is filtered, the water is separated, the solution is dried and then evaporated to leave a white solid. This solid is slurried in hydrocarbon solvent to remove monomer and then evaporated to leave desired product that can be formulated in a suitable solvent for use as a spinon polymer. The molecular weight (Mw) of the product produced can be varied from about 400 and 200,000 atomic mass units (amu) depending on the reaction conditions. It has been found that materials with a Mw of from about 5,000 to about 60,000 amu are desirable. It has also been found that materials with a Mw of from about 10,000 to about 50,000 amu are somewhat more desirable and materials with a Mw of from about 20,000 to about 40,000 amu are most desirable.

The polymer of the upper level dielectric material is dispersed in a suitable compatible solvent and applied onto the lower level dielectric. Suitable solvent compositions include those which have a boiling point of about 120° C. or less, preferably about 100° C. or less. Suitable high volatility solvent composition nonexclusively include methanol, ethanol, n-propanol, isopropanol, n-butanol, propyl acetate and mixtures thereof Other relatively high volatility solvent compositions which are compatible with the other ingredients can be readily determined by those skilled in the art. The solvent is preferably present in an amount of from about 10% to about 900% by weight of the overall blend, more preferably from about 15% to about 80% and most preferably from about 40% to about 60% by weight of the overall blend with the polymer. The upper dielectric material may be applied to the coated substrates via the conventional coating methods mentioned above. The thickness of the dielectric film on the substrate may vary depending on the amount of liquid dielectric that is applied to the substrate, but typically the thickness may range from about 500 Å to about 50,000 Å, and preferably from about 1000 Å to about 12000 Å. The amount of dielectric liquid applied to the substrate may vary from about 1 ml to about 10 ml, and preferably from about 2 ml to about 8 ml. In the preferred embodiment, the liquid material is spun onto the surface the lower level dielectric according to similar techniques as those mentioned above.

The invention is useful in a single damascene process sequence. Microvias may be formed in the dielectric layers by well known photolithographic techniques using a photoresist composition. The dual layered coated substrate may be imagewise patterned and the removed of portions of the dielectrics form via cavities through both of the dielectric layers. Such are formed in a manner well known in the art such as by coating the top of the upper dielectric layer with a photoresist, imagewise exposing to actinic radiation such as through a suitable mask, developing the photoresist and etching away portions of both of the dielectric layers to form vias. The photoresist composition may be positive working or negative working and are generally commercially available. Suitable positive working photoresists are well known in the art and may comprise an o-quinone diazide radiation sensitizer. The o-quinone diazide sensitizers include the o-quinone-4-or-5-sulfonyl-diazides disclosed in U. S. Pat. Nos. 2,797,213; 3,106,465; 3,148,983; 3,130,047; 3,201, 329; 3,785,825; and 3,802,885. When o-quinone diazides are used, preferred binding resins include a water insoluble, aqueous alkaline soluble or swellable binding resin, which is preferably a novolak. Suitable positive photodielectric resins may be obtained commercially, for example, under the trade name of AZ-P4620 from Clariant Corporation of Somerville, N.J. The photoresist is then imagewise exposed to actinic radiation such as light in the visible, ultraviolet or infrared regions of the spectrum through a mask, or scanned by an electron beam, ion or neutron beam or X-ray radiation. Actinic radiation may be in the form of incoherent light or coherent light, for example, light from a laser. The photoresist is then imagewise developed using a suitable solvent, such as an aqueous alkaline solution. Optionally the photoresist is heated to cure the image portions thereof and thereafter developed to remove the nonimage portions and define a via mask. Next the photoresist is completely removed from the dielectric surface and the inside walls of the vias by plasma etching. Plasma generators which are capable of are described in U.S. Pat. Nos. 5,174,856 and 5,200,031.

Next the vias are filled with a conductive metal which fills the vias in area and also forms a layer on top of the hardened upper dielectric. Suitable metals include aluminum, aluminum alloys, copper, copper alloys, tantalum, tungsten, titanium or other metal typically employed in the formation of microelectronic devices. The metal may be applied by such techniques as vapor deposition, sputtering, evaporation, electroplating and the like. The thickness of the metal layer is preferably from about 3000 to 5000 Angstroms. Typically the metal is applied by first forming a barrier metal seeding layer on the walls of the vias and on the top dielectric. Then the balance of the metal is applied. The barrier metal serves to prevent diffusion of the conductive metal into the dielectric layers. Barrier metal may be, for example, a nitride such Ti, TaN or TiN. Next the metal is removed from the upper dielectric layer such as by chemical mechanical polishing or an etch back by techniques which are well known in the art. The hardened upper dielectric layer acts as a polish stop. These steps may be repeated to provide a series of suitable layers and conductive paths over one another on the substrate.

The invention is also useful in a dual damascene process. The first lower non-silicon containing dielectric coating is formed on a substrate and cured. The top of the cured lower dielectric layer is then coated with an upper layer of a high or low organic content, silicon containing dielectric and cured. Trenches are then formed in the second dielectric layer by well known photolithographic techniques using a photoresist composition. The lower dielectric layer acts as an etch stop. The underlying first dielectric layer is then provided with vias by repeating the processing sequence of applying a photoresist layer portion, imagewise exposing through a mask having apertures centered on the trenches but having a narrower diameter. After developing the photoresist and etching away portions of the lower dielectric layer, vias are formed. Next the vias and trenches are filled with a conductive metal which also forms a layer on top of the hardened upper dielectric layer. Next the metal layer is removed such as by chemical mechanical polishing or an etch back by techniques. The hardened upper dielectric layer acts as a polish stop and a microelectronic device results.

The following nonlimiting examples serve to illustrate the invention.

EXAMPLE 1

Preparation of 20 Mole Percent Methylhydridosiloxane

A 2L Morton flask was fitted with a dry-ice condenser and a stirrer connected to an Arrow 1750 motor. Reactor was placed in a water bath set at 25° C. The flask was purged with $N_2$ and during the reaction $N_2$ was blown across the top of the condenser into an NaOH scrubber. 60.25 g of Amberjet 4200(Cl) ion exchange resin catalyst, 80 mL of ethanol, 25 mL of water, and 1000 mL of hexanes were added to the flask, and stirring was started. 58 mL(0.575 mol.) of trichlorosilane and 17 mL(0.145 mol.) of methyltrichlorosilane (20.1 mol % methyltrichlorosilane) were combined together in an FEP bottle. This mixture of silanes was added to the Morton flask by peristaltic pump through a ¼" Teflon tube at a set rate of 8.0 RPM. Calculated addition rate was 2.5 mL/min. After addition was completed, stirring was continued for 185 min. Solution was filtered by vacuum through a Whatman #4 filter in a buchner funnel. Solution was added to a separatory funnel and the lower, aqueous layer was discarded. The upper layer was dried over 171 g of 4 Å molecular sieves for 3.5 hr. Solution was filtered by vacuum through a Whatman #2 filter paper in a buchner funnel. Solution was evaporated on a Buchi rotary evaporator at 60° C. Yield was 25.2 g of white solid. Mw was measured by GPC as 26,014 AMU with a polydispersity of 13.68.

EXAMPLE 2

Preparation of 80 Mole Percent Methyihydridosiloxane

A 1L jacketed reactor equipped with a nitrogen inlet, dry ice condenser and a mechanical stirrer was charged with 1000 mL hexanes, 80 mL ethanol, 25 mL water and 61.3 g Amberjet 4200 catalyst. The mixture was equilibrated for 0.5 hr with stirring at 25° C. (circulating bath). A mixture of trichlorosilane (14.3 mL, 0. 142 Mol) and methyltrichlorosilane (66.7 mL, 0.568 Mol) was added to the reactor using a peristaltic pump over a period of 35 minutes. Upon completion of the silane addition, hexane was pumped through the lines for 10 minutes. The reaction was stirred for 23 hours, then filtered through a Whatman #4 filter. The filtered solution was placed in a separatory funnel and the water/ethanol layer removed. The remaining hexane solution was dried over 4 Å molecular sieves (170 g) for 5 h and then filtered through a 1 μm filter. The hexanes were removed using a rotary evaporator to give a white solid product (23.1 g), 52% yield. The GPC of this product, referenced to polystyrene standards gave a Mw of 11,885 with a polydispersity of 6.5.

EXAMPLE 3

A thin film of a poly(arylene ether) polymer is formed on a 4" silicon wafer using a conventional spin-coating technique. After spin-coating, the film is subjected to a hot-plate bake at a temperature of 150° C. for 2 min. The film thickness after the spinning and baking processes is in the range of 8000 to 10000 Å. Thermal curing is carried out at 425° C. or one hour in a horizontal furnace with $N_2$ flow at atmospheric pressure. A thin film of the polymer of Example 1 is formed on the poly(arylene ether) polymer using a conventional spin-coating technique. After spin-coating, the film is subjected to a hot-plate bake at a temperature of 150° C. for 2 min. The film thickness after the spinning and baking processes is in the range of 8000 to 10000 Å. Thermal curing is carried out at 425° C. for one hour in a horizontal furnace with $N_2$ flow at atmospheric pressure.

EXAMPLE 4

A thin film of a poly(arylene ether) polymer is formed on a 4" silicon wafer using a conventional spin-coating technique. After spin-coating, the film is subjected to a hot-plate bake at a temperature of 150° C. for 2 min. The film thickness after the spinning and baking processes is in the range of 8000 to 10000 Å. Thermal curing is carried out at 425° C. for one hour in a horizontal furnace with $N_2$ flow at atmospheric pressure. A thin film of the polymer of Example 2 is formed on the poly(arylene ether) polymer using a conventional spin-coating technique. After spin-coating, the film is subjected to a hot-plate bake at a temperature of 150° C. for 2 min. The film thickness after the spinning and baking processes is in the range of 8000 to 10000 Å. Thermal curing is carried out at 425° C. for one hour in a horizontal furnace with $N_2$ flow at atmospheric pressure.

EXAMPLE 5

Two thin films of poly(arylene ether) polymer were formed on a 200 mm Si wafer substrate by spin coating technique. After deposition the films were baked on a series of hot-plates at 150° C., 200° C. and 250° C. for one minute on each hot-plate. One thin film was subsequently placed in a horizontal furnace at 425° C. for 1 hour under atmospheric pressure and $N_2$ flow to ensure thermal cross-linking.

Following this process film thickness for both cured and uncured poly(arylene ether) polymer films were measured on a Woollam spectroscopic ellipsometer. The thickness of the cured film was 6181 Å (+/−73 Å) and the uncured film was 6354 Å (+/−190 Å). Subsequently a thin layer the polymer from Example 2 was deposited on both cured and uncured films by spin coating technique. After deposition, all composite spin on polymer stacks were baked on a series of hot-plates at 150° C., 200° C. and 350° C. for one minute on each hot-plate. All films were subsequently placed in a horizontal furnace at 425° C. for 1 hour under atmospheric pressure and $N_2$ flow to ensure thermal crosslinking. The thickness of both the poly(arylene ether) films and the overlying Example 2 polymer films were measured on a Woollam spectroscopic ellipsometer. The thickness of the poly(arylene ether) film which was exposed to two thermal excursions to 425° C. was 6182 Å (+/−61 Å) while the thickness of the poly(arylene ether) film which was exposed to one thermal excursion to 425° C. was 6310 Å (+/−182 Å). The thickness of the Example 2 polymer films on both poly(arylene ether) films were 1289 Å (+/−11 Å) and 1315 Å (+/−13 Å) respectively.

EXAMPLE 6

The coated substrates of Examples 3 and 4 are spin coated with AZ-P4620 photoresist from Clariant Corporation of Somerville, N.J. and baked. The photoresist is then imagewise exposed to ultraviolet radiation through a mask. The photoresist is then developed using an aqueous alkaline solution to remove the nonimage portions and define a via mask. Vias are then formed by etching. Next the photoresist is completely removed from the dielectric surface and the inside walls of the vias by plasma etching in a plasma chamber using a typical etching tool. The wafer is then rinsed in a solvent to remove post etch metal residues. A deionized water rinse follows. The via is then formed by sputtering of a Ti/TiN barrier metal and W-CVD via fill. The W is then chemical mechanical polished electron beam exposed layer and the metal patterning process is repeated.

EXAMPLE 7

A lower dielectric thin film of a poly(arylene ether) polymer is formed on a 4" silicon wafer using a conventional spin-coating technique. After spin-coating, the film is subjected to a hot-plate bake at a temperature of 150° C. for 2 min. The film thickness after the spinning and baking processes is in the range of 8000 to 10000 Å. Thermal curing is carried out at 425° C. for one hour in a horizontal furnace with $N_2$ flow at atmospheric pressure.

An upper dielectric thin film of the polymer of Example 1 is formed on the poly(arylene ether) layer using a conventional spin-coating technique. After spin-coating, the film is subjected to a hot-plate bake at a temperature of 150° C. for 2 min. The film thickness after the spinning and baking processes is in the range of 8000 to 10000 Å. Thermal curing is carried out at 425° C. for one hour in a horizontal furnace with $N_2$ flow at atmospheric pressure. The polymer of Example 1 film is spin coated with AZ-P4620 photoresist and baked. The photoresist is then imagewise exposed to ultraviolet radiation through a mask. The photoresist is then developed using an aqueous alkaline solution to remove the nonimage portions and define a trench mask. Trenches are then formed by etching. Next the photoresist is completely removed from the dielectric surface and the inside walls of the vias by plasma etching in a plasma chamber using a typical etching tool. The wafer is then rinsed in a solvent to remove post etch metal residues. A deionized water rinse follows. The cured poly(arylene ether) serves as an etch stop. Another layer of the photoresist is spin coated on the thin film of polymer from Example 1. The photoresist is then imagewise exposed to ultraviolet radiation through a mask which allows exposure through the vias down to the exposed poly(arylene ether) layer. The photoresist is then developed using an aqueous alkaline solution to remove the nonimage portions and define a via mask. Vias are then formed in the exposed poly(arylene ether) layer by etching. Next the photoresist is completely removed from the dielectric surface and the inside walls of the vias by plasma etching in a plasma chamber using a typical etching tool. The wafer is then rinsed in a solvent to remove post etch metal residues. A deionized water rinse follows. Vias are then formed in the upper dielectric thin film and trenches formed in the poly(arylene ether) layer by sputtering of Ti/TiN barrier metal and W-CVD via fill. The W is then chemical mechanical polished back to the electron beam exposed layer and the patterning process is repeated.

EXAMPLE 8

Example 7 is repeated except the polymer of Example 2 is used instead of the polymer of Example 1. Similar results are noticed. While the present invention has been particularly shown and described with reference to preferred embodiments, it will be readily appreciated by those of ordinary skill in the art that various changes and modifications may be made without departing from the spirit and scope of the invention. In particular, while the foregoing examples have employed certain dielectric materials, these are only exemplary and many others could be used as well. It is intended that the claims be to interpreted to cover the disclosed embodiments, those alternatives which have been discussed above and all equivalents thereto.

What is claimed is:

1. A dielectric coated substrate which comprises:

(a) a first dielectric composition film on a substrate which comprises a non-silicon containing or substantially non-silicon containing organic polymer; and (b) a second dielectric composition film on the first dielectric film, which second dielectric composition comprises a polymer having a structure selected from the group consisting of I and II:

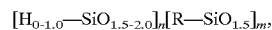

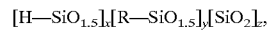                    I.

wherein the sum of n and m, or the sum or x, y and z is from about 8 to about 5000, and m and y are selected such that carbon containing substituents are present in an amount of less than about 40 Mole percent; and wherein R, is selected from substituted and unsubstituted straight chain and branched alkyl groups, cycloalkyl groups, substituted and unsubstituted aryl groups, and mixtures thereof;

$[HSiO_{1.5}]_n[RSiO_{1.5}]_m,$ $[H_{0.4-1.0}SiO_{1.5-1.8}]_n[R_{0.4-1.0}SiO_{1.5-1.8}]_m,$ $[H_{0-1.0}SiO_{1.5-2.0}]_n[RSiO_{1.5}]_m,$     II.

wherein the sum of n and m is from about 8 to about 5000 and m is selected such that the carbon containing substituent is present in an amount of from about 40 Mole percent or greater; and $[HSiO_{1.5}]_x[RSiO_{1.5}]_y[SiO_2]_z;$ wherein the sum of x, y and z is from about 8 to about 5000 and y is selected such that the carbon containing substituent is present in an amount of about 40 Mole % or greater; and wherein R, is selected from substituted and unsubstituted straight chain and branched alkyl groups, cycloalkyl groups, substituted and unsubstituted aryl groups, and mixtures thereof.

2. The dielectric coated substrate of claim 1 wherein the first dielectric composition film comprises a material selected from the group consisting of poly(arylene ether), a fluorinated poly(arylene ether), fluorocarbons, benzocyclobutene, polyimides and fluorinated polyimides.

3. The dielectric coated substrate of claim 1 wherein the substrate comprises gallium arsenide, germanium, silicon, silicon germanium, lithium niobate, compositions containing silicon and combinations thereof.

4. A microelectronic device which comprises a dielectric coated substrate which comprises:

(a) a first dielectric composition film on a substrate which comprises a non-silicon containing or substantially non-silicon containing organic polymer; and (b) a second dielectric composition film on the first dielectric film, which second dielectric composition comprises a polymer having a structure selected from the group consisting of I and II:

$[H—SiO_{1.5}]_n[R—SiO_{1.5}]_m,$ $[H_{0.4-1.0}SiO_{1.5-1.8}]_n[R_{0.4-1.0}—SiO_{1.5-1.8}]_m,$ $[H_{0-1.0}—SiO_{1.5-2.0}]_n[R—SiO_{1.5}]_m,$ $[H—SiO_{1.5}]_x[R—SiO_{1.5}]_y[SiO_2]_z,$     I.

wherein the sum of n and m, or the sum or x, y and z is from about 8 to about 5000, and m and y are selected such that carbon containing substituents are present in an amount of less than about 40 Mole percent; and wherein R, is selected from substituted and unsubstituted straight chain and branched alkyl groups, cycloalkyl groups, substituted and unsubstituted aryl groups, and mixtures thereof;

$[HSiO_{1.5}]_n[RSiO_{1.5}]_m,$ $[H_{0.4-1.0}SiO_{1.5-1.8}]_n[R_{0.4-1.0}SiO_{1.5-1.8}]_m,$ $[H_{0-1.0}SiO_{1.5-2.0}]_n[RSiO_{1.5}]_m,$     II.

wherein the sum of n and m is from about 8 to about 5000 and m is selected such that the carbon containing substituent is present in an amount of from about 40 Mole percent or greater; and $[HSiO_{1.5}]_x[RSiO_{1.5}]_y[SiO_2]_z;$ wherein the sum of x, y and z is from about 8 to about 5000 and y is selected such that the carbon containing substituent is present in an amount of about 40 Mole % or greater; and wherein R, is selected from substituted and unsubstituted straight chain and branched alkyl groups, cycloalkyl groups, substituted and unsubstituted aryl groups, and mixtures thereof.

5. The microelectronic device of claim 4 wherein the first dielectric composition film comprises a material selected from the group consisting of poly(arylene ether), a fluorinated poly(arylene ether), fluorocarbons, benzocyclobutene, polyimides and fluorinated polyimides.

6. The microelectronic device of claim 4 wherein the substrate comprises gallium arsenide, germanium, silicon, silicon germanium, lithium niobate, compositions containing silicon and combinations thereof.

* * * * *